(12) United States Patent
Jin et al.

(10) Patent No.: US 6,858,544 B2
(45) Date of Patent: Feb. 22, 2005

(54) METHOD FOR FORMING BIT LINE OF SEMICONDUCTOR DEVICE

(75) Inventors: Sung Gon Jin, Gyeonggi-do (KR); Jai Sun Roh, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/608,808

(22) Filed: Jun. 30, 2003

(65) Prior Publication Data

US 2004/0067656 A1 Apr. 8, 2004

(30) Foreign Application Priority Data

Jul. 15, 2002 (KR) .................................. 10-2002-0041144

(51) Int. Cl.$^7$ ...................... H01L 21/302; H01L 21/461
(52) U.S. Cl. .................... 438/738; 438/250; 438/253
(58) Field of Search ......................... 438/738, 250–256, 438/393–398, 672–675

(56) References Cited

U.S. PATENT DOCUMENTS

| | | |
|---|---|---|
| 5,879,986 A | 3/1999 | Sung |
| 6,008,085 A | 12/1999 | Sung et al. |
| 6,351,037 B1 | 2/2002 | Liaw et al. |
| 6,355,954 B1 | 3/2002 | Gall et al. |
| 6,391,705 B1 | 5/2002 | Hsiao et al. |
| 6,413,830 B1 | 7/2002 | Wahlstrom |

*Primary Examiner*—Richard Elms
*Assistant Examiner*—Beth E. Owens
(74) *Attorney, Agent, or Firm*—Heller Ehrman White and McAuliffe LLP

(57) ABSTRACT

A method for forming a bit line of a semiconductor device wherein a first opening in an interlayer insulation film is formed in a P+ S/D (source/drain) region, a post etch treatment (PET) for stabilizing the resistance in the P+ S/D opening is performed, followed by the subsequent formation of a second opening in the N+ S/D region, such that any increase of the resistance of the N+ S/D opening by the PET is thereby prevented.

18 Claims, 9 Drawing Sheets

METHOD FOR FORMING BIT LINE OF SEMICONDUCTOR DEVICE

BACKGROUND

1. Technical Field

The present disclosure relates to a method for forming a bit line of a semiconductor device, and more particularly to a method for forming a bit line of a semiconductor device wherein a first opening in a P+ S/D region, and then forming a second opening in an N+ S/D region to prevent increase of the resistance in the N+ source/drain (S/D) region opening during a post etch treatment (PET) for stabilizing the resistance in a P+ S/D region opening.

2. Description of the Related Art

Recently, the size of a unit cell of a semiconductor memory device has decreased continuously due to high integration and large capacity of the semiconductor memory device. As the size of a memory cell of a dynamic random access memory (DRAM) which leads improvements in integration density is decreased, the vertical structure because extremely complex, which calls for a method for increasing an effective area of a capacitor.

A conventional semiconductor device employs a bit line consisting of polycide which is composed of doped polysilicon and tungsten silicide as a data input/output path to increase integration of the device and improve information processing capability.

However, the resistance of the conventional bit line structure in increased as the size of an opening in decreased. In order to solve the foregoing problem, a tungsten bit line having a low resistance value has been introduced.

However, even in the case of the tungsten bit line, the resistance of the opening for forming the bit line shows large changes during a subsequent thermal process. Specifically, since the resistance of a P+ S/D region remarkably increases, a subsequent PET is performed only for the P+ S/D region opening.

The PET is performed after simultaneously forming in the P+ S/D region and the N+ S/D region openings. Thus, while the resistance of the P+ S/D region opening is decreased, the resistance of the N+ S/D region opening is increased.

The resistance of the opening in the N+ S/D region is contrary to the resistance of the opening in the P+ S/D region. Generally, when the resistance of the P+ S/D region opening is reduced and stabilized, the resistance of the N+ S/D region opening is increased, and when the resistance of the N+ S/D region opening is reduced, the resistance of the P+ S/D region opening is increased.

Specifically, when the PET is performed to reduce the resistance of the P+ S/D region opening having an average resistance value of 1200Ω, the resistance of the P+ S/D region opening is stabilized at an average value of 900Ω. However, the resistance of the N+ S/D region opening having a average resistance value of 280 to 300Ω is increased to 450Ω(see FIGS. 1 and 2).

A conventional method for forming a bit line will be described with reference to FIGS. 3a to 3g.

Referring to FIG. 3a, a conductive layer for a word line (not shown) and a nitride film (not shown) are sequentially formed in a cell region of a semiconductor substrate 1.

Thereafter, the conductive layer for the word line and the hard mask nitride film are patterned via a photolithography process using a mask for a gate electrode to form a word line pattern 4 including a conductive layer pattern 2 for the word line and a nitride film pattern 3 which is a hard mask layer. A spacer 5 is then formed at a sidewall of the word line pattern 4.

A polysilicon layer (not shown) is formed on the entire surface of the resulting structure including the word line pattern 4 and the spacer 5 and then etched to form a plug 6.

Next, P+ S/D region 7 and an N+ S/D region 8 are formed in a peripheral region of the resulting structure, and an interlayer insulating film 9 is then formed on the entire surface of the resulting structure using an oxide film.

Referring to FIG. 3b, openings 11a, 11b and 11c exposing the plug region 6, the P+ S/D region 7 and the N+ S/D region 8, respectively, are formed by etching the interlayer insulating film 9. Thereafter, the opening 11b in the P+ S/D region 7 is subjected to a PET.

Referring to FIG. 3c, a photoresist layer 15 is formed on the entire surface of the resulting structure.

Referring to FIG. 3d, a portion of the photoresist layer 15 on the P+ S/D region 7 is removed to form an opening 11b-1 exposing the P+ S/D region 7.

Opening 11b-1 in the P+ S/D region 7 is subject to a P+ ion implantation process 17 to stabilize the resistance of the opening 11b-1. Thereafter, the photoresist layer 15 is stripped.

Referring to FIG. 3e, a rapid thermal annealing "RTA"process is performed to compensate for damaged oxide film in the P+ S/D region 7 due to the ion implantation process. When subsequent processes are performed without the RTA process, the damaged portions are etched faster than the undamaged portions during the subsequent cleaning process, and thus a step difference 23 is generated between the P+ ion implant region and the non-implant region, resulting in a bridge 25 (see FIG. 4).

Referring to FIG. 3f, a barrier metal layer 19 is formed on the entire surface of the interlayer insulating film 9 including the opening using Ti/TiN. The Ti layer reacts with the Si substrate by an RTA process to form $TiSi_2$, thereby stabilizing the resistance of the opening.

Thereafter, a tungsten layer 21 is formed on the entire surface of the resulting structure.

Referring to FIG. 3g, the tungsten layer 21 is etched to form a tungsten bit line 21a.

In accordance with the conventional method for forming the bit line of the semiconductor device, since the openings are simultaneously formed in the P+ S/D region and the N+ S/D region, the resistance of the N+ S/D region opening is increased due to the subsequent PET. Moreover, the RTA process must be introduced in order to compensate for damages of the interlayer insulating film during the additional P+ ion implantation process. These complicate the manufacturing process and decrease the integration and operation speed of the device.

SUMMARY OF THE DISCLOSURE

It is an object of the present invention to provide a method for forming the bit line of the semiconductor device, and to form openings for the bit lines having stable resistances, by forming a first opening in a P+ S/D region, performing a PET, and forming a second opening in an N+ S/D region.

To achieve the above-described object of the invention, a method for forming bit line of semiconductor device, comprising the steps of:

(a) forming a P+ S/D region and an N+ S/D region on a semiconductor substrate;

(b) forming a planarized interlayer insulating film on the entire surface of the resulting structure;

(c) etching the interlayer insulating film to form a first opening exposing the P+ S/D region;

(d) subjecting the entire surface of the resulting structure, including the first opening, to a P+ ion implantation process;

(e) etching the interlayer insulating film to form a second opening exposing the N+ S/D region;

(f) forming a barrier metal layer on the entire surface of the resulting structure including the first and second openings;

(g) forming a tungsten layer filling the first and second openings on the entire surface of the resulting structure; and (h) selectively etching the tungsten layer and the barrier metal layer to form a bit line.

Preferably, the etching process in the step (c) uses $CF_4$, $CHF_3$, $O_2$, Ar, CO, or mixed gas thereof, and further comprises over-etching the exposed P+ S/D region.

The P+ ion implantation process in the step (d) uses $BF_2$ gas with energy of 10 to 30 KeV, preferably 10 to 25 KeV and a dose of $1.0 \times 10^{-15}$ to $5.0 \times 10^{-15}$ atom/$cm^2$, preferably $2.0 \times 10^{-15}$ to $4.0 \times 10^{-15}$ atom/$cm^2$.

Preferably, the second opening is formed in the N+ S/D region in the same manner as the first opening in the P+ S/D region.

DETAILED DESCRIPTION OF THE PREFERRED EMBODIMENTS

The present disclosure will be described in detail with reference to the accompanying drawings.

Many changes and modifications to the embodiments described herein could be made. The scope of some changes is discussed above. The scope of others will become apparent from the appended claims.

A method for forming a bit line of a semiconductor device will be described.

Figure 1:
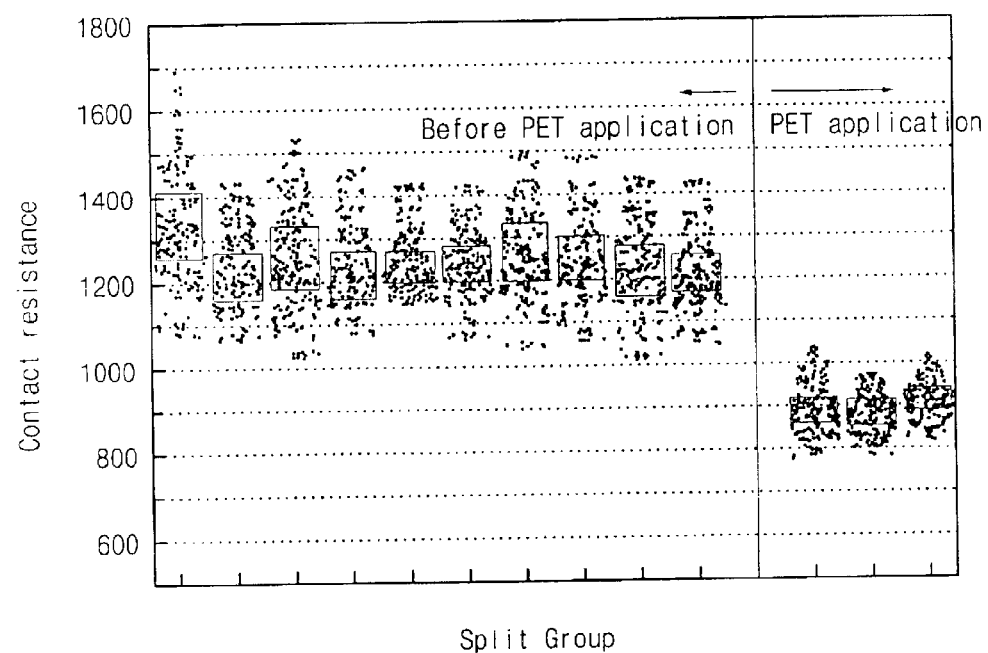
FIG. 1 is a graph showing resistances of a P+ S/D region opening manufactured in accordance with the conventional art with and without a PET process.
Figure 2:
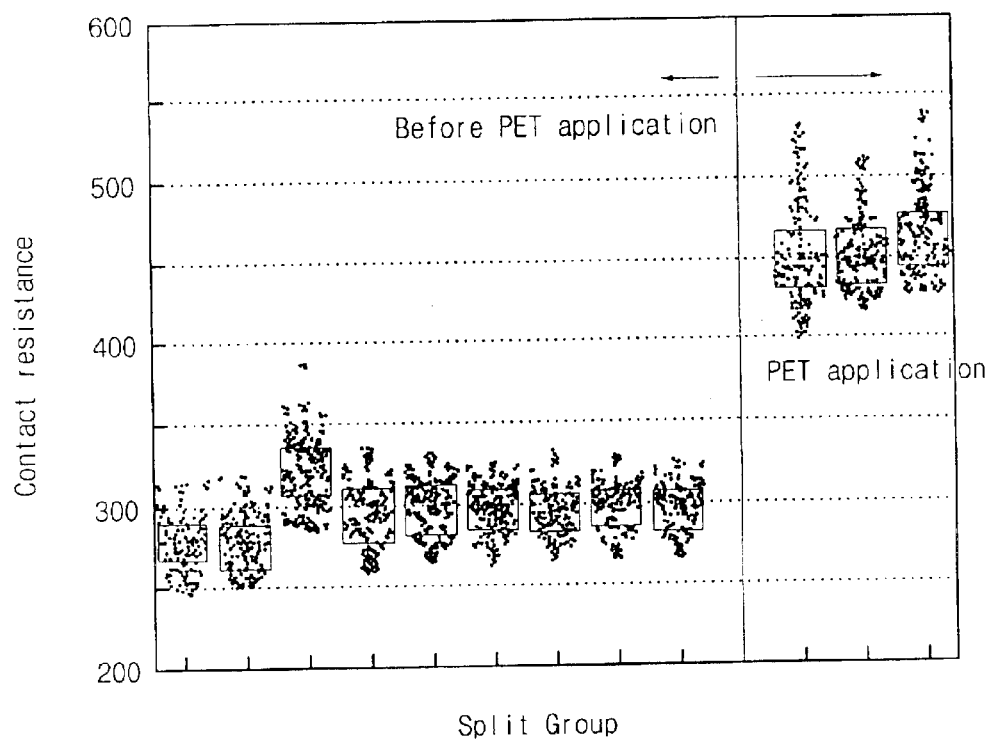
FIG. 2 is a graph showing resistances of a N+ S/D region opening manufactured in accordance with the conventional art with and without a PET process.
Figure 3A:
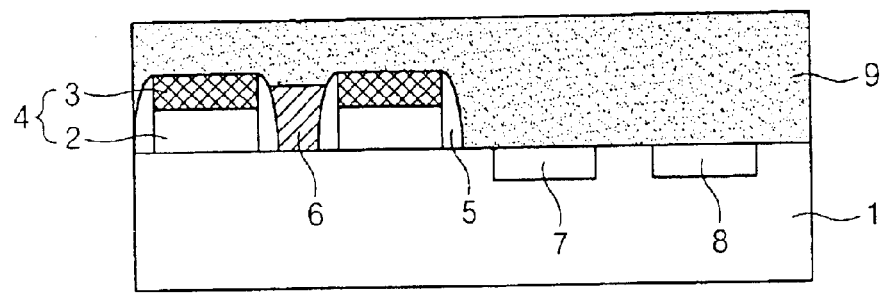
FIGS. 3a through 3g are cross-sectional diagrams illustrating a conventional method for forming a bit line of a semiconductor device.
Figure 3B:
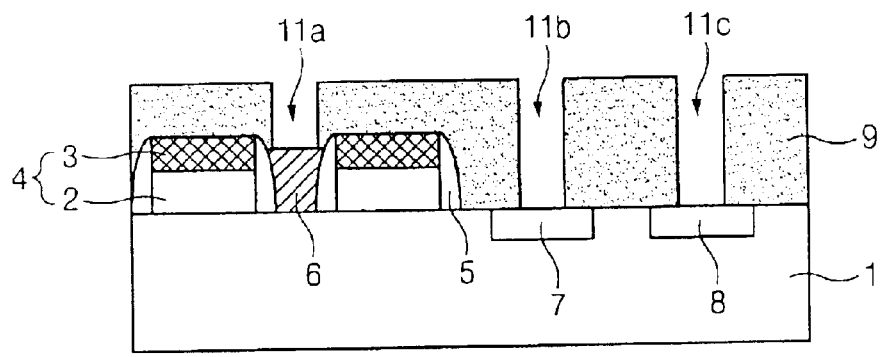
Figure 3C:
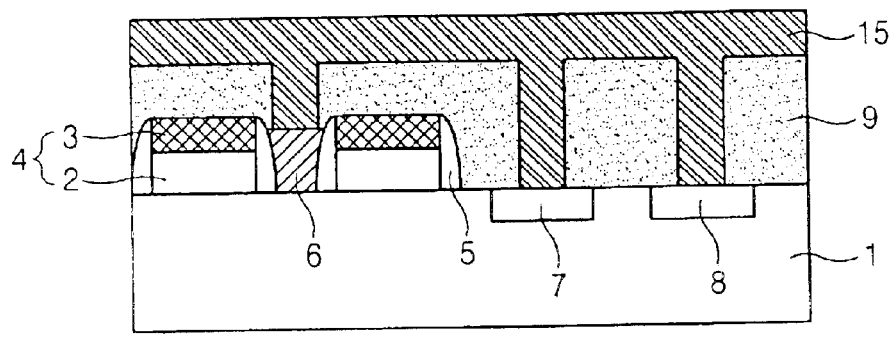
Figure 3D:
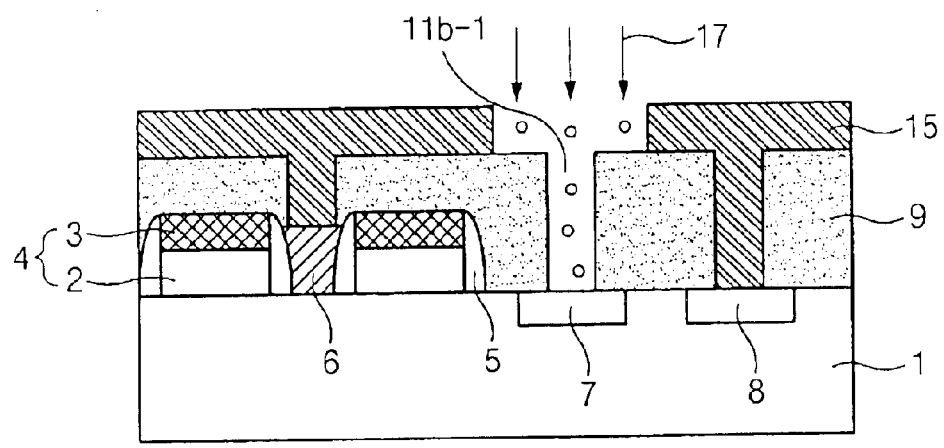
Figure 3E:
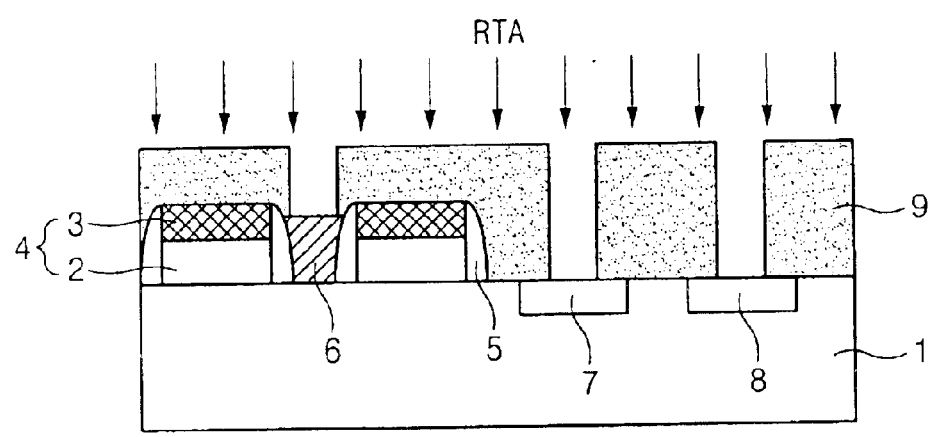
Figure 3F:
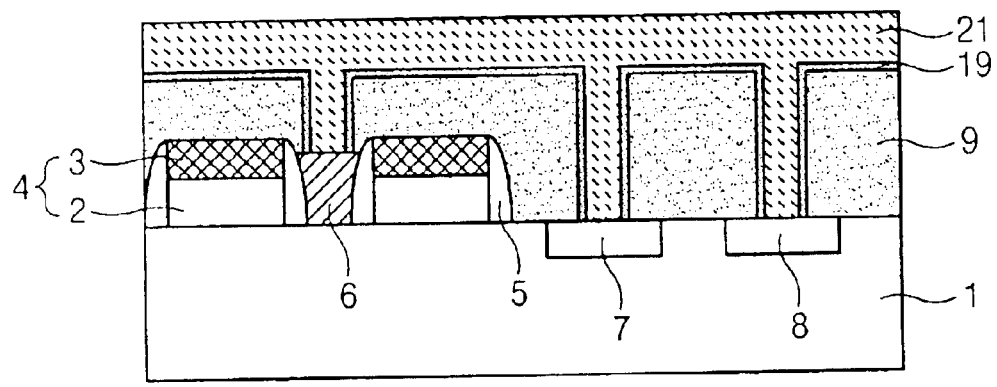
Figure 3G:
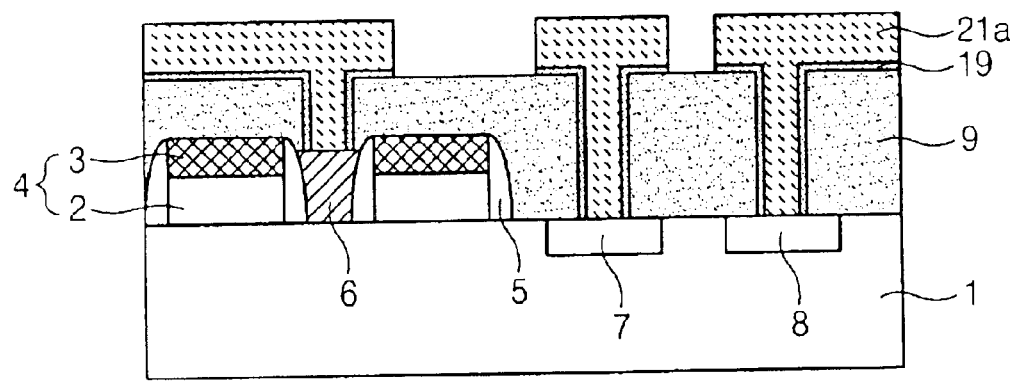
Figure 4:
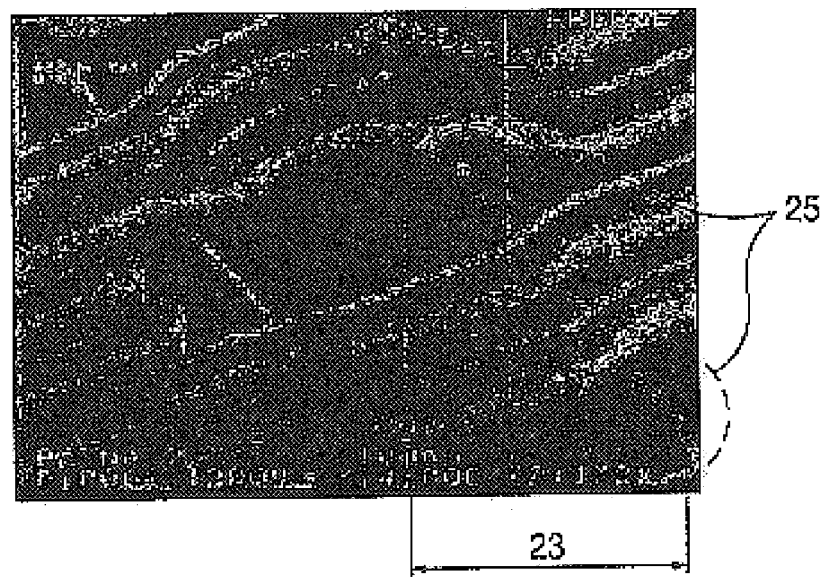
FIG. 4 shows a step difference generated due to an ion implantation process in accordance with the conventional method.
Figure 5A:
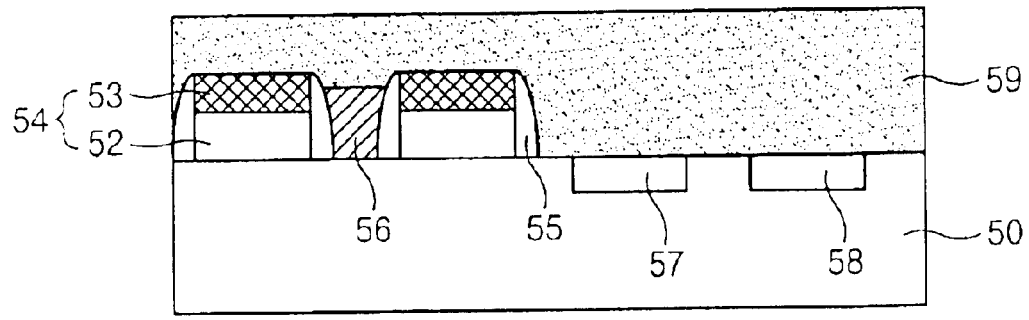
FIGS. 5a through 5f are cross-sectional diagrams illustrating a method for forming a bit line of a semiconductor device in accordance with the present invention.

Referring to FIG. 5a, a conductive layer for a word line (not shown) and a nitride film (not shown) are sequentially formed in a cell region of a semiconductor substrate 50.

Thereafter, the conductive layer for the word line and the hard mask nitride film are patterned via a photolithography process using a mask for a gate electrode to form a word line pattern 54 including a conductive layer pattern 52 for the word line and a nitride film pattern 53 which is a hard mask layer.

Preferably, the conductive layer for the word line consists of doped silicon, polysilicon, W, WN, $WSi_x$ or $TiSi_x$.

A spacer 55 is formed at a sidewall of the word line pattern 54. Thereafter, a polysilicon layer (not shown) is formed on the entire surface of the resulting structure including the word line pattern 54 and the spacer 55 and then etched to form a plug 56.

Next, P+ S/D region 57 and an N+ S/D region 58 are formed in a peripheral region of the resulting structure, and an interlayer insulating film 59 is then formed on the entire surface of the resulting structure using an oxide film.

Figure 5B:
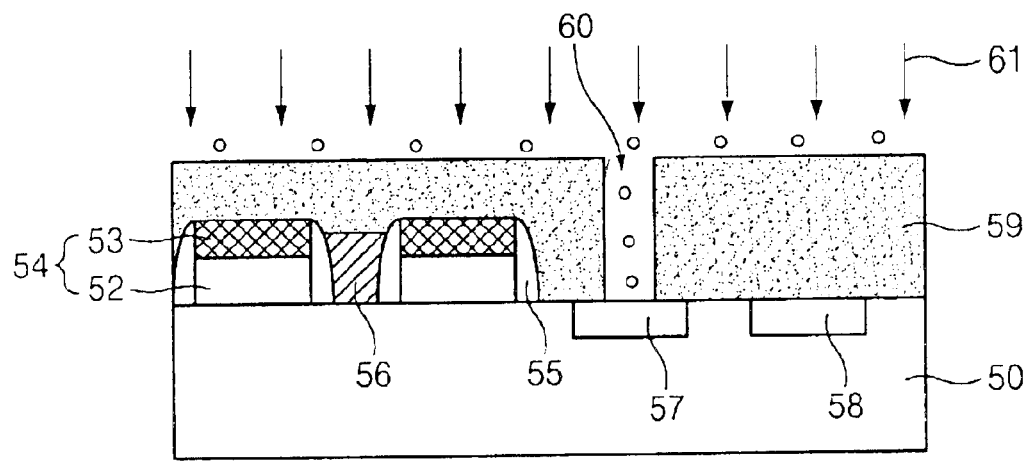

Referring to FIG. 5b, the interlayer insulating film 59 is etched to form a first opening 60 exposing the P+ S/D region 57. Preferably, the etching process is performed using a gas selected from the group consisting of $CF_4$, $CHF_3$, $O_2$, Ar, CO, and combinations thereof, and more preferably $CF_4$ gas.

The etching process for forming the first opening 60 is preferably an over-etching process so that the substrate is etched as well as the interlayer insulating film 59. The thickness of the substrate etched in the etching process is 20 to 50%, preferably, 30 to 50% of the thickness of the interlayer insulating film 59.

Thereafter, the first opening 60 is subjected to a PET using at least one gas selected from the group consisting of $CF_4$, Ar and $O_2$ and the resulting structure then subjected to a P+ ion implantation process 61 to stabilize the first opening 60.

The PET removes portions of the substrate damaged during the formation of the first opening. In the PET process, 20 to 150 Å, preferably 50 to 100 Å of semiconductor substrate in depth is etched. During the PET, the $O_2$ gas used in the PET oxidize the silicon substrate to form an oxide. The oxide is removed in a subsequent cleaning process before forming a barrier metal layer to improve bonding capability of the silicon substrate and the barrier metal layer, thereby lowering the resistance of the P+ S/D region opening.

Unlike the conventional arts, since a partial damage of the interlayer insulating film does not occur during the PET, a subsequence RTA process is not required.

The P+ ion implantation process 61 is performed using $BF_2$ gas with an energy of 10 to 30 KeV, preferably 10 to 25 KeV and a dose of $1.0 \times 10^{-15}$ to $5.0 \times 10^{-15}$ atom/$cm^2$, preferably $2.0 \times 10^{-15}$ to $4.0 \times 10^{-15}$ atom/$cm^2$.

Figure 5C:
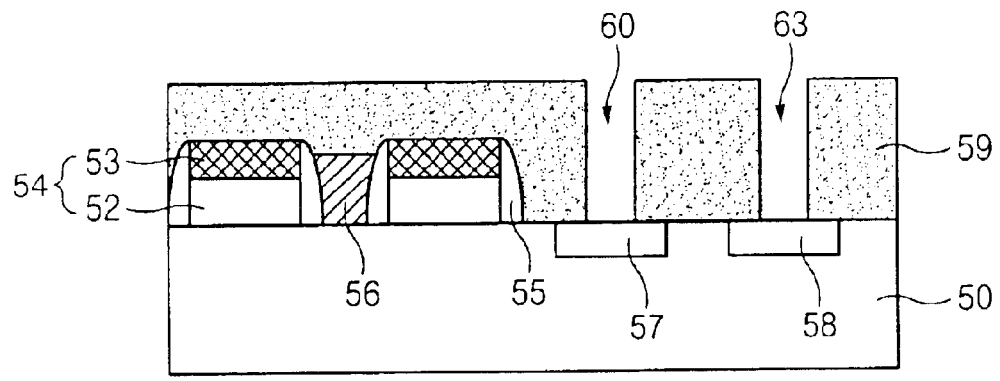

Referring to FIG. 5c, the interlayer insulating film 59 is etched to form a second opening 63 exposing the N+ S/D region 58. The etching process is performed under the same process conditions as the etching process for forming the first opening 60. However it is preferable that the PET and the additional ion implantation process are not performed.

Figure 5D:
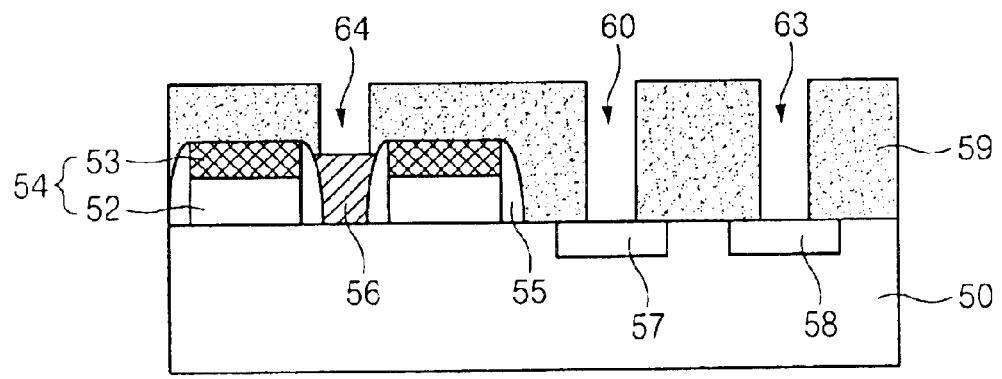

Referring to FIG. 5d, the interlayer insulating film 59 is etched to form a third opening 64 exposing the plug 56 in the cell region. The etching process is performed in the same manner as the etching processes for forming the first opening 60 and the second opening 63.

Figure 5E:
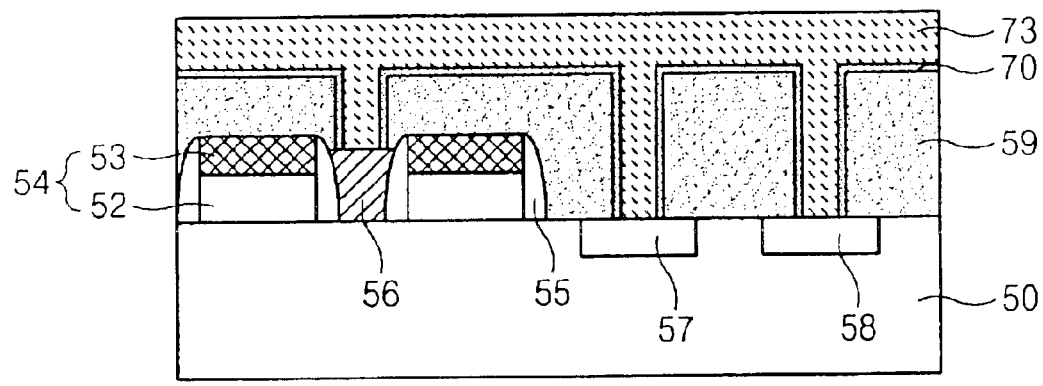

Referring to FIG. 5e, a barrier metal layer 70 is formed on the entire surface of the resulting structure including the first opening 60, the second opening 63 and the third opening 64 using Ti/TiN. The resulting structure is then subjected to an RTA process to form a $TiSi_2$ film (not shown) between a Ti layer and the substrate 50 thereby stabilizing the resistances of the openings.

Thereafter, a tungsten layer 73 filling the first to third openings 60, 63 and 64 is formed on the barrier metal layer 70.

Figure 5F:
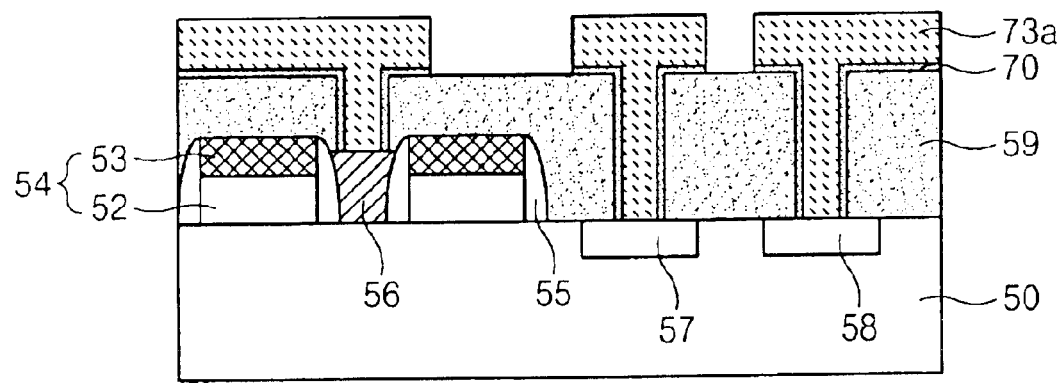

Referring to FIG. 5f, the tungsten layer 73 and the barrier metal layer 70 are etched to expose interlayer insulating film 59, thereby forming a bit line 73a.

As described above, in accordance with the present invention, only the first opening in the P+ S/D region is subjected to the PET, and the subsequent RTA process is not required. Moreover, the additional P+ ion implantation process is performed on the entire surface of the wafer, which prevents local step differences and bridging phenomenon. Accordingly, the openings in the P+ S/D region and the N+ S/D region have stable resistances.

What is claimed is:

1. A method for forming a bit line of a semiconductor device, comprising the steps:

(a) forming a P+ S/D region and an N+ S/D region on a semiconductor substrate;

(b) forming a planarized interlayer insulating film on the entire surface of the resulting structure;

(c) etching the interlayer insulating film to form a first opening exposing the P+ S/D region;

(d) subjecting the entire surface of the resulting structure, including the first opening, to a P+ ion implantation process;

(e) etching the interlayer insulating film to form a second opening exposing the N+ S/D region;

(f) forming a barrier metal layer on the entire surface of the resulting structure including the first and second openings;

(g) forming a tungsten layer filling the first and second openings on the entire surface of the resulting structure; and (h) selectively etching the tungsten layer and the barrier metal layer to form a bit line.

2. The method according to claim 1, wherein the etching process in the step (c) uses at least one gas selected from the group consisting of $CF_4$, $CHF_3$, $O_2$, Ar and CO.

3. The method according to claim 1, wherein the step (c) further comprises over-etching the exposed P+ S/D region.

4. The method according to claim 3, wherein a depth of the P+ S/D region etched by the over-etching process is 20 to 50% of a thickness of the interlayer insulating film.

5. The method according to claim 4, wherein a depth of the P+ S/D region etched by the over-etching process is 30 to 50% of a thickness of the interlayer insulating film.

6. The method according to claim 3, wherein the over-etching process further comprises performing a post etch treatment (PET).

7. The method according to claim 6, wherein the PET is performed using at least one gas selected from the group consisting of $CF_4$, Ar and $O_2$.

8. The method according to claim 6, wherein the PET is an etching process for etching 20 to 150 Å of semiconductor substrate in depth.

9. The method according to claim 8, wherein the PET is an etching process for etching 50 to 150 Å of semiconductor substrate in depth.

10. The method according to claim 1, wherein the P+ ion implantation process is performed using $BF_2$ gas.

11. The method according to claim 1, wherein the P+ ion implantation process is performed with an energy ranging from 10 to 30 KeV.

12. The method according to claim 11, wherein the P+ ion implantation process is performed with an energy ranging from 10 to 25 KeV.

13. The method according to claim 1, wherein the P+ ion implantation process is performed with a dose ranging from $10 \times 10^{-15}$ to $5.0 \times 10^{-15}$ atom/$cm^2$.

14. The method according to claim 13, wherein the P+ ion implantation process is performed with a dose ranging from $2.0 \times 10^{-15}$ to $4.0 \times 10^{-15}$ atom/$cm^2$.

15. The method according to claim 1, wherein the etching process in the step (e) uses at least one gas selected from the group consisting of $CF_4$, Ar and $O_2$.

16. The method according to claim 1, wherein the step (e) further comprises over-etching the exposed N+ S/D region.

17. The method according to claim 16, wherein a depth of the N+ S/D region etched by the over-etching process is 20 to 50% of a thickness of the interlayer insulating film.

18. The method according to claim 17, wherein a depth of the N+ S/D region etched by the over-etching process is 30 to 50% of a thickness of the interlayer insulating film.

* * * * *